(12) United States Patent
Forbes et al.

(10) Patent No.: US 7,339,423 B2
(45) Date of Patent: Mar. 4, 2008

(54) TECHNIQUE TO IMPROVE THE GAIN AND SIGNAL TO NOISE RATIO IN CMOS SWITCHED CAPACITOR AMPLIFIERS

(75) Inventors: Leonard Forbes, Corvallis, OR (US); David R. Cuthbert, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/728,537

(22) Filed: Mar. 26, 2007

(65) Prior Publication Data

US 2007/0182482 A1 Aug. 9, 2007

Related U.S. Application Data

(62) Division of application No. 11/196,117, filed on Aug. 3, 2005, now Pat. No. 7,230,479.

(51) Int. Cl.
*H03F 1/02* (2006.01)
(52) U.S. Cl. .......................... 330/9; 327/124
(58) Field of Classification Search ............... 330/9; 327/124, 307
See application file for complete search history.

(56) References Cited

U.S. PATENT DOCUMENTS

| | | | |
|---|---|---|---|
| 1,113,149 A | 10/1914 | Armstrong | |
| 4,404,525 A * | 9/1983 | Amir et al. | ............... 330/9 |
| 4,806,874 A * | 2/1989 | Michel | ................ 330/9 |
| 5,777,516 A | 7/1998 | Koifman et al. | |
| 5,880,630 A * | 3/1999 | Iwamoto et al. | ............... 330/9 |
| 6,037,836 A * | 3/2000 | Yoshizawa | ................ 330/9 |
| 6,310,514 B1 | 10/2001 | Johnson | |
| 6,377,084 B1 | 4/2002 | Forbes | |
| 6,538,476 B2 | 3/2003 | Forbes | |
| 6,538,491 B1 | 3/2003 | Spanoche | |
| 6,741,104 B2 | 5/2004 | Forbes et al. | |
| 6,784,734 B2 | 8/2004 | Amourah | |
| 6,853,241 B2 | 2/2005 | Fujimoto | |
| 2004/0263253 A1 | 12/2004 | Drottar | |

* cited by examiner

*Primary Examiner*—Henry Choe
(74) *Attorney, Agent, or Firm*—TraskBritt, PC

(57) ABSTRACT

The present invention comprises switched capacitor amplifiers including positive feedback on semiconductor devices, wafers, and systems incorporating same and methods for amplifying signals using positive feedback, while maintaining a stable gain and producing an improved signal-to-noise ratio. One embodiment includes a switched capacitor amplifier comprising a CMOS amplifier, a feed-in switched capacitor, and a feedback switched capacitor. The feed-in switched capacitor couples an input signal to the non-inverting input of the CMOS amplifier. Similarly, the feedback switched capacitor couples the amplifier output to the non-inverting input to create a positive feedback loop. A capacitance of the feedback switched capacitor relative to a capacitance of the feed-in switched capacitor comprises a feedback proportion. This feedback proportion may be configured to maintain a stable gain of the switched capacitor amplifier and increase a signal-to-noise ratio of the switched capacitor amplifier, even with the switched capacitor amplifier in a positive feedback arrangement.

17 Claims, 11 Drawing Sheets

TECHNIQUE TO IMPROVE THE GAIN AND SIGNAL TO NOISE RATIO IN CMOS SWITCHED CAPACITOR AMPLIFIERS

CROSS-REFERENCE TO RELATED APPLICATION

This application is a divisional of application Ser. No. 11/196,117, filed Aug. 3, 2005, now U.S. Pat. No. 7,230,479, issued Jun. 12, 2007. The disclosure of the previously referenced U.S. patent application is hereby incorporated by reference in its entirety.

BACKGROUND OF THE INVENTION

1. Field of the Invention

The present invention relates to amplifier circuits. More specifically, the present invention relates to switched capacitor CMOS amplifiers and operation thereof.

2. Description of Related Art

Many systems that manipulate and generate analog signals require amplification of those signals for presentation to other circuitry within the system. In Dynamic Random Access Memories (DRAM), as well as other semiconductor devices, amplifiers may be required in operational blocks such as sense amplifiers, input signal level sensors, phase locked loops, delay locked loops, general sensors, and various other analog circuits.

Regenerative receivers were first widely used in vacuum tube radio receivers. They provided a large signal gain, increased selectivity, an improved signal-to-noise ratio, and enabled the first widespread use of radio communication. This was accomplished with a minimal number of components by the use of positive feedback or "signal regeneration." Positive feedback or regeneration allowed the same signal to be amplified many times by the same vacuum tube, resulting in a very high signal gain.

In feedback systems, whether negative or positive, the gain-bandwidth product generally remains constant. The positive feedback used in regenerative receivers served to increase the selectivity of the receiver since the bandwidth of the receiver decreased as the gain increased in order to preserve the gain-bandwidth product. A decrease in the bandwidth resulted in less noise interference and, when coupled with a higher gain, resulted in a much-improved signal-to-noise ratio and the new era of practical wireless communications was born.

In the modern era, positive feedback is employed in many digital Complementary Metal Oxide Semiconductor (CMOS) integrated circuits, such as sense amplifiers and level restore circuits. The positive feedback or regeneration results in a high effective transconductance (i.e., gain), with the ability to switch large capacitive loads in short time periods. However, in these digital circuits, the positive feedback gain is very large and the circuit is inherently unstable. The output from these positive feedback digital amplifiers is a large signal voltage generally intended to swing to a voltage level that may be interpreted as a one or a zero, rather than a small analog signal. Furthermore, positive feedback digital amplifiers generally produce a large non-linear output voltage, which is often limited by the power supply voltage (VDD). A cross-coupled positive feedback CMOS sense amplifier is an example of a widely used positive feedback digital amplifier, which enabled the common realization of many semiconductor memory types, such as Dynamic Random Access Memory (DRAM), and Static Random Access Memory (SRAM).

Analog CMOS amplifiers, on the other hand, amplify small analog signals and are generally configured to develop a stable gain on an output signal relative to an input signal without transitioning into an unstable or oscillating mode. Unfortunately, analog CMOS amplifiers are limited by the low gain inherent in MOS devices. The maximum gain of a single CMOS transistor, or the open circuit gain, may be as low as ten and typically is in the range of about twenty-five.

Switched capacitors coupled with a CMOS amplifier, in a conventional negative feedback configuration, can create a fixed gain determined by the ratio of capacitances for the overall switched capacitor CMOS amplifier. FIG. 1A illustrates a conventional switched capacitor amplifier 20 with negative feedback. The switched capacitor amplifier 20 shown in FIG. 1A includes a conventional operational amplifier 10 with a non-inverting input 12 connected to a ground voltage. A switched capacitor configuration couples an input signal 16 to an inverting input 14 of the operational amplifier 10. In a feedback path, another switched capacitor configuration couples the operational amplifier output 18 with the inverting input 14 of the operational amplifier 10.

This switched capacitor configuration is often termed a resettable gain circuit that functions as an amplifier during one phase of a clock cycle (ph1 in FIG. 1A) and is reset during a second phase of the clock cycle (ph2 in FIG. 1A). During the gain phase, ph1 is asserted and ph2 is negated. As a result, the n-channel transistors n11 and n15 are conducting while n-channel transistors n12, n13, and n14 are off. FIG. 1B illustrates an approximation of the amplifier circuit during the gain phase by removing the transistors that are off during the gain phase and showing the transistors that are on during the gain phase as a short circuit connection. The resulting circuit leaves a feed-in capacitor Cin coupled between the input signal 16 and the inverting input 14 of the operational amplifier 10 and a feedback capacitor Cc coupled between the operational amplifier output 18 and the inverting input 14 of the operational amplifier 10.

During the reset phase, ph2 is asserted and ph1 is negated. As a result, the n-channel transistors n12, n13, and n14 are conducting while transistors n11 and n15 are off. FIG. 1C illustrates an approximation of the amplifier in the reset phase by removing the transistors that are off during the reset phase and showing the transistors that are on during the reset phase as a short circuit connection. The resulting circuit leaves one side of the feed-in capacitor Cin and one side of the feedback capacitor Cc coupled to ground to reset the capacitors.

Unfortunately, as the gain of switched capacitor CMOS amplifiers increases, noise from the CMOS amplifier may increase even faster, resulting in a small signal-to-noise ratio. There is a need for CMOS amplifier circuits that can develop a higher stable gain relative to the signal-to-noise ratio.

BRIEF SUMMARY OF THE INVENTION

The present invention comprises switched capacitor amplifiers including positive feedback and methods for amplifying signals using positive feedback, while maintaining a stable gain and producing an improved signal-to-noise ratio. One exemplary embodiment of the present invention includes a switched capacitor amplifier comprising a CMOS amplifier, a feed-in switched capacitor, and a feedback switched capacitor. The CMOS amplifier is configured as a single input amplifier including a non-inverting input and an amplifier output. The feed-in switched capacitor operably couples an input signal to the non-inverting input of the CMOS amplifier. Similarly, the feedback switched capacitor operably couples the amplifier output to the non-inverting input to create a positive feedback loop. A capacitance of the feedback switched capacitor relative to a capacitance of the feed-in switched capacitor comprise a feedback proportion. This feedback proportion may be configured to maintain a stable gain of the switched capacitor amplifier and increase a signal-to-noise ratio of the switched capacitor amplifier, even with the switched capacitor amplifier configured in a positive feedback arrangement.

Another exemplary embodiment of the present invention includes a switched capacitor amplifier comprising a CMOS amplifier, a feed-in switched capacitor, and a feedback switched capacitor. The CMOS amplifier is configured as a dual-input amplifier including a non-inverting input, an inverting input, and an amplifier output. A reference signal carrying a reference voltage operably couples to the inverting input of the CMOS amplifier. The feed-in switched capacitor operably couples an input signal to the non-inverting input of the CMOS amplifier. Similarly, the feedback switched capacitor operably couples the amplifier output to the non-inverting input to create a positive feedback loop. A capacitance of the feedback switched capacitor relative to a capacitance of the feed-in switched capacitor comprise a feedback proportion. This feedback proportion may be configured to maintain a stable gain of the switched capacitor amplifier and increase a signal-to-noise ratio of the switched capacitor amplifier, even with the switched capacitor amplifier configured in a positive feedback arrangement.

Another exemplary embodiment of the present invention includes a switched capacitor amplifier comprising a positive feedback CMOS amplifier, a feed-in switched capacitor, and a feedback switched capacitor. The positive feedback CMOS amplifier is configured as a dual-input amplifier including a non-inverting input, an inverting input, an amplifier output, and an internal feedback signal to generate positive feedback within the positive feedback CMOS amplifier. A reference signal carrying a reference voltage operably couples to the non-inverting input of the CMOS amplifier. The feed-in switched capacitor operably couples an input signal to the inverting input of the CMOS amplifier. Similarly, the feedback switched capacitor operably couples the amplifier output to the inverting input to create a negative feedback loop. A capacitance of the feedback switched capacitor relative to a capacitance of the feed-in switched capacitor comprise a feedback proportion. This feedback proportion, when combined with the positive feedback CMOS amplifier, may be configured to maintain a stable gain of the switched capacitor amplifier and increase a signal-to-noise ratio of the switched capacitor amplifier, even with the switched capacitor amplifier configured in a positive feedback arrangement.

Another exemplary embodiment of the present invention includes a method of amplifying a signal. The method comprises coupling a reference voltage to an inverting input of a CMOS amplifier and coupling an input signal, through a switched feed-in capacitance, to a non-inverting input of the CMOS amplifier. The method further comprises amplifying the non-inverting input using the CMOS amplifier to generate an amplifier output and feeding back the amplifier output, through a switched feedback capacitance, to the non-inverting input. The switched feedback capacitance and the switched feed-in capacitance may be selected to maintain a stable gain of the CMOS amplifier and increase a signal-to-noise ratio of the CMOS amplifier.

Yet another exemplary embodiment, in accordance with the present invention, includes another method of amplifying a signal. The method comprises coupling a reference voltage to a non-inverting input of a CMOS amplifier and coupling an input signal, through a switched feed-in capacitance, to an inverting input of the CMOS amplifier. The method further comprises amplifying the inverting input using a positive feedback CMOS amplifier to generate an amplifier output and feeding back the amplifier output, through a switched feedback capacitance, to the inverting input. The switched feedback capacitance and the switched feed-in capacitance may be selected to maintain a stable gain of the positive feedback CMOS amplifier and increase a signal-to-noise ratio of the positive feedback CMOS amplifier.

Semiconductor devices, wafers and systems incorporating the switched capacitor amplifiers of the present invention are also encompassed thereby.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention comprises switched capacitor amplifiers including positive feedback and methods for amplifying signals using positive feedback, while maintaining a stable gain and producing an improved signal-to-noise ratio.

Figure 1A:
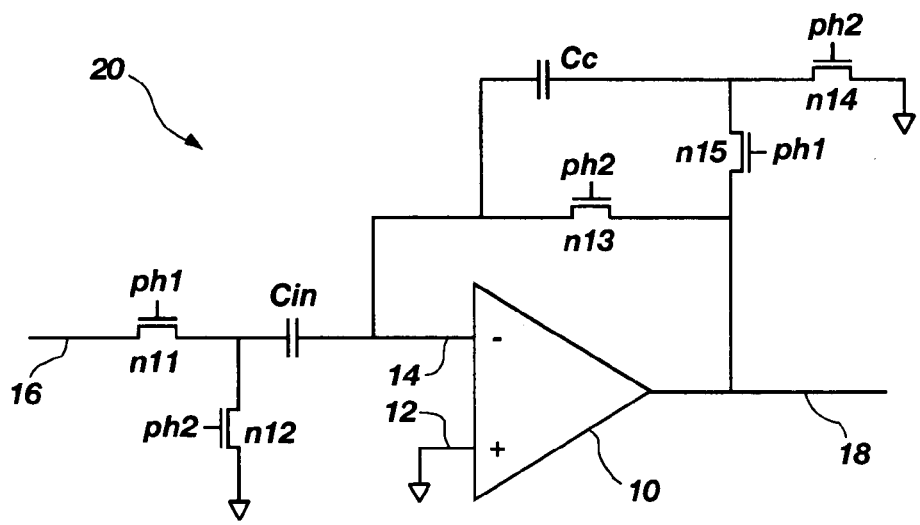
FIG. 1A is a circuit diagram of a conventional switched capacitor amplifier.
Figure 1B:
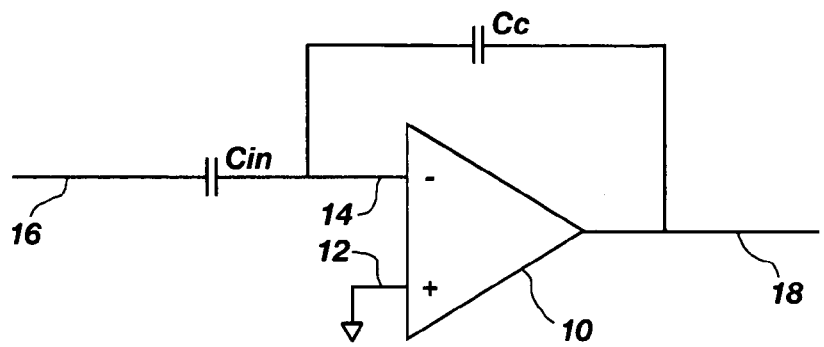
FIG. 1B depicts a circuit approximation of the switched capacitor amplifier of FIG. 1A when in an operational mode.
Figure 1C:
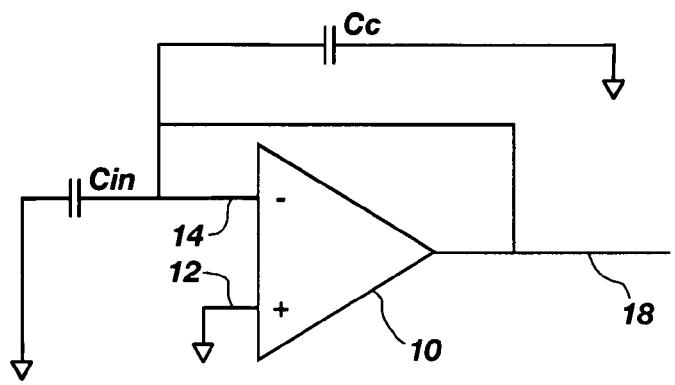
FIG. 1C depicts a circuit approximation of the switched capacitor amplifier of FIG. 1A when in a reset mode.

As stated earlier, FIG. 1A illustrates a conventional switched capacitor amplifier 20 with negative feedback. During the gain phase, the switched capacitor amplifier 20 performs an amplifying function with a gain that can be approximated by $-(C_{in}/C_c)$. However, any input offset voltage across the feed-in capacitor Cin and the feedback capacitor Cc may build up charge, causing the input offset voltage to be amplified, and may eventually cause the amplifier output 18 to become saturated when it nears the positive or negative voltage sources, which may cause the amplified output to be clipped. To correct this charge buildup, the reset phase discharges any buildup and the gain stage can again operate accurately. In addition, canceling the input offset voltage reduces 1/f noise, which can be a significant noise source in many CMOS circuits.

Noise is an important factor in switched capacitor amplifiers. Significant noise sources, other than 1/f noise may be device thermal noise and kT/C noise. The basic technique to limit noise is to use large area transistors and capacitance values such that kT/C noise dominates. Unfortunately, using large area devices to limit noise results in significant area utilization on integrated circuits. Using longer channel length devices to try to reduce the drain conductance, and improve the gain of the transistor stages also results in large size devices and large area integrated circuits.

Figure 2:
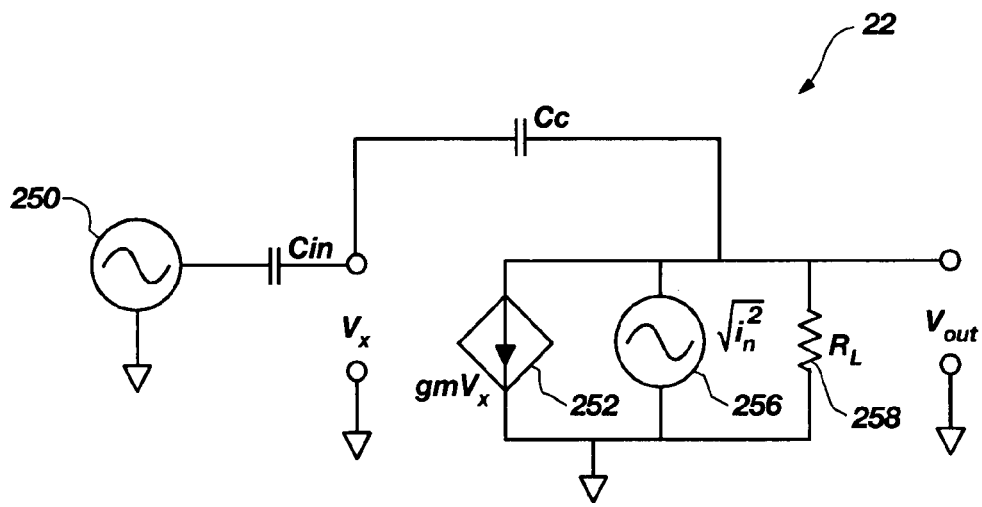
FIG. 2 depicts an exemplary simulation model for the switched capacitor amplifier of FIG. 1A.

An approximate small signal simulation model 22 of the switched capacitor amplifier 20 of FIG. 1A is shown in FIG. 2. It should be noted that the simulation model 22 is defined for the gain phase of the switched capacitor amplifier 20 and without the n-channel transistors. The reset phase is not simulated. The simulation model 22 includes a signal voltage source 250, a feed-in capacitor Cin, a voltage dependent current sink 252, a noise source 256, a load 258, and a feedback capacitor Cc. The signal voltage source 250 is configured for generating a small analog signal for amplification. The voltage dependent current sink 252 models the amplification of the CMOS amplifier 200 by generating a current sink proportional to the input signal 110.

The noise source 256 models noise that may be generated by the CMOS amplifier. Noise signals generally have power spread across a frequency spectrum. As a result, noise is generally defined as having a spectral density with an average noise power (referred to as mean square noise) normalized over a one Hz bandwidth, and is generally noted as $V_n^2$ for a voltage noise source or $I_n^2$ for a current noise source.

Without feedback, the gain of the CMOS amplifier 10 is:

$$\text{gain}=(g_m*R_L),$$

and the mean square noise voltage referred back to the input of the amplifier is:

$$V_n^2 = i_n^2/g_m^2$$

After feedback is applied by connecting Cc, and assuming $g_m*R_L \gg 1$, the gain becomes simply:

$$\text{gain}=-C_{in}/C_c$$

and the bandwidth in radians/second is:

$$\omega_c = g_m/C_{in}.$$

the mean square noise voltage referred to the input is still:

$$V_n^2 = i_n^2/g_m^2$$

The noise power referred to the input of the amplifier will then be:

$$\text{NoisePower} = \frac{1}{2\pi} * \frac{i_n^2}{g_m C_{in}}$$

The assumption that $g_m*R_L$ is much greater than one is not entirely accurate for CMOS amplifiers, which may not have a very high gain, but it is adequate for description and simulation purposes to keep within the classical approximations used in electronic circuit analysis.

Figure 3:
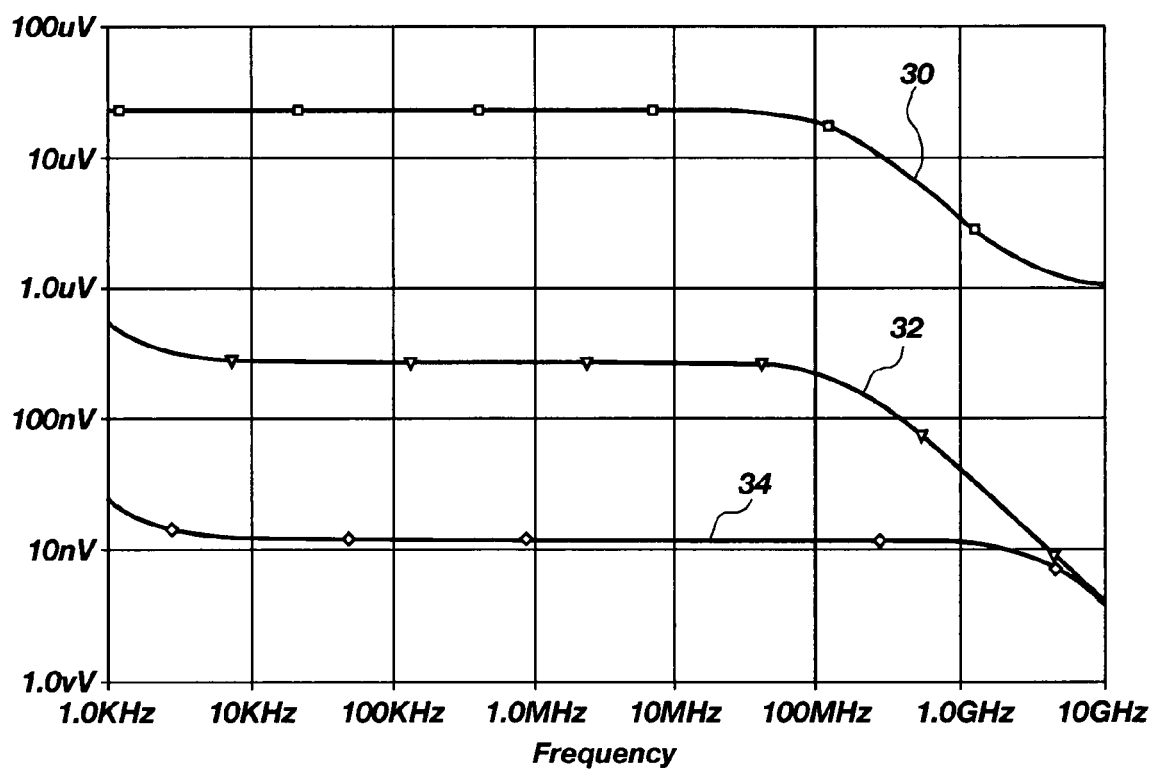
FIG. 3 depicts a simulation result for the simulation model of FIG. 2.

Circuit simulation results for the switched capacitor amplifier 20 of FIG. 1A, and the simulation model 22 of FIG. 2, are illustrated in FIG. 3. The simulation results are for a feedback capacitance of about 0.015 pF and a feed-in capacitance of about 1 pF, resulting in a Cc/Cin ratio (also referred to as a feedback proportion) of about 0.015. An output signal curve 30 illustrates a gain of about 22 and a bandwidth of about 160 MHz. An output noise curve 32 illustrates the noise at the output of the operational amplifier as about $272_{nV}/\sqrt{Hz}$. An input noise curve 34 illustrates the noise at the input of the operational amplifier as about $12_{nV}/\sqrt{Hz}$.

Figure 4:
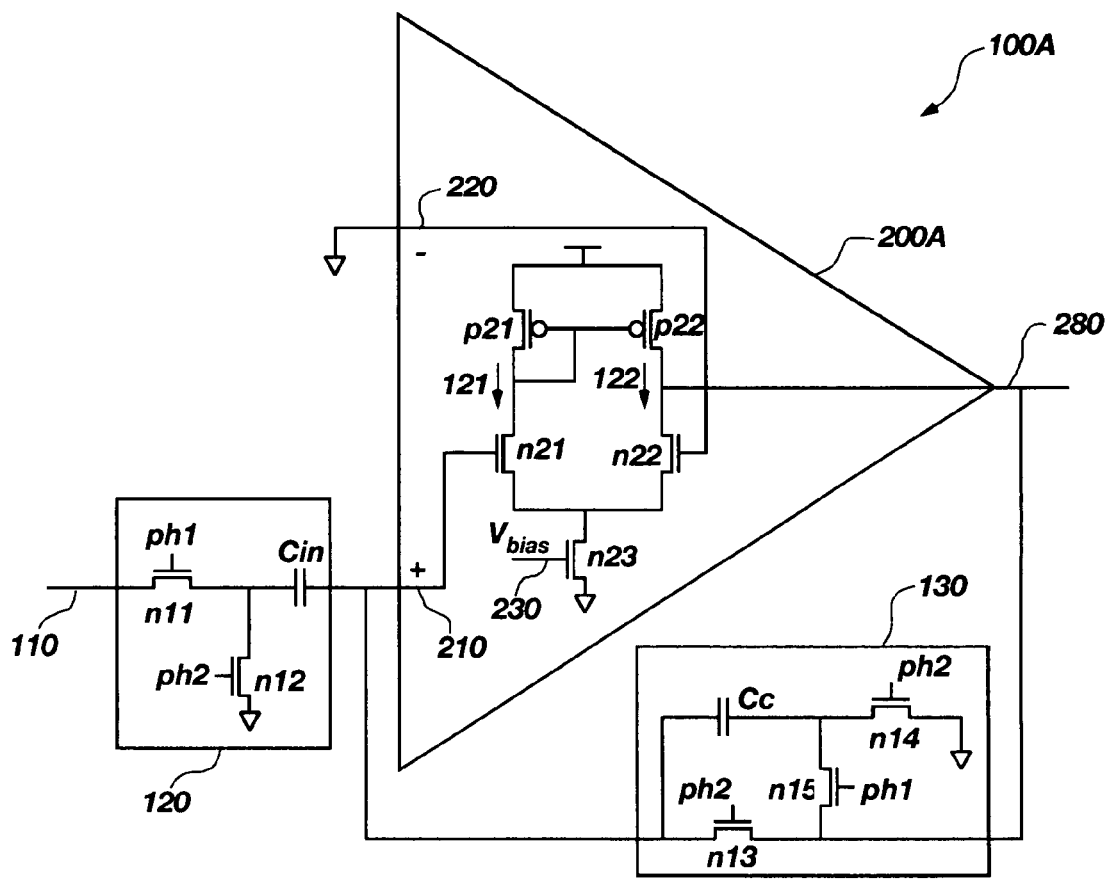
FIG. 4 is a circuit diagram of an exemplary embodiment of a switched capacitor CMOS amplifier according to the present invention.

Rather than using negative feedback, the present invention uses positive feedback to increase a signal-to-noise ratio while maintaining a stable gain for a switched capacitor amplifier. FIG. 4 illustrates one exemplary embodiment of the present invention comprising a switched capacitor amplifier 100A with positive feedback. The switched capacitor amplifier 100A shown in FIG. 4 includes a CMOS amplifier 200A with the inverting input 220 connected to a ground voltage. A feed-in switched capacitor 120 couples an input signal 110 to the non-inverting input 210 of the CMOS amplifier 200A. In the feedback path, a feedback switched capacitor 130 couples the amplifier output 280 with the non-inverting input 210 of the CMOS amplifier 200A.

Those of ordinary skill in the art will recognize that the connection of the inverting input 220 to ground may be accomplished inside the CMOS amplifier 200A creating a single input CMOS amplifier 200A. It will be further recognized that the inverting input 220 may also be coupled to a reference signal creating a full differential amplifier, as explained more fully below.

The feed-in switched capacitor 120 includes n-channel transistors n11 and n12 and a feed-in capacitor Cin. The feedback switched capacitor 130 includes n-channel transistors n13, n14, and n15 and a feedback capacitor Cc. The operation of the feed-in switched capacitor 120 and the feedback switched capacitor 130 are essentially the same as described above for the negative feedback amplifier. Those of ordinary skill in the art will recognize that other switching networks for performing the reset phase are possible and contemplated as within the scope of the present invention. For example, in a fully differential amplifier configuration, a similar reset circuit maybe implemented for the non-inverting input 210. In addition, other reset circuits using different configurations of switches, perhaps with other components such as resistors and additional capacitors may be used also.

As illustrated in FIG. 4, the CMOS amplifier 200A includes a well-known circuit configurations generally referred to as a current mirror. In the CMOS amplifier 200A shown in FIG. 4, the p-channel transistor p21 (also referred to as a reference transistor p21) is connected in a diode configuration with the gate and drain connected together. The reference transistor p21 operates in the saturation region because the gate and drain are connected to the same potential. As a result, the transistor operates with voltage to current properties similar to a p-n junction diode.

The current mirror configuration comprises two transistors of the same type (e.g., both p-channels or both n-channels) in which the sources of the transistors are connected together and the gates of the transistors are connected together. Current mirrors operate on the theory that if the two transistors are similarly processed and have sizes W/L (i.e., width/length) in a defined proportion N, then the current relationship through the two transistors will have the same proportion N. For example, in the CMOS amplifier 200A shown in FIG. 4, if the reference transistor p21 and a current mirror transistor p22 have the same W/L, they will have substantially the same amount of current flowing through them. This is so because both transistors are connected to the same source, and have the same gate to source voltage, which defines the magnitude of the drain current. Typically, current mirrors are designed with the two transistors having the same size (i.e., the proportion N=1). However, other proportions may be used.

Referring to the CMOS amplifier 200A in FIG. 4, the current mirror configuration, comprising the reference transistor p21 and the current mirror transistor p22, creates proportional active loads 258 for a differential transistor pair comprising a first differential transistor n21 and a second differential transistor n22.

The drains of the differential transistor pair are coupled to the current mirror and the sources of the differential transistor pair are connected to a bias current sink. The gate of the first differential transistor n21 is coupled to the non-inverting input 210 and the gate of the second differential transistor n22 is connected to the inverting input 220. The bias current sink provides a bias current for setting a desired operating point for the differential transistor pair. In many implementations, the bias current source may be implemented as a bias transistor n23, as shown in FIG. 4, with its source coupled to ground and its gate driven by a bias voltage 230 at a voltage level suitable for creating the desired bias current through the bias transistor n23.

Figure 5:
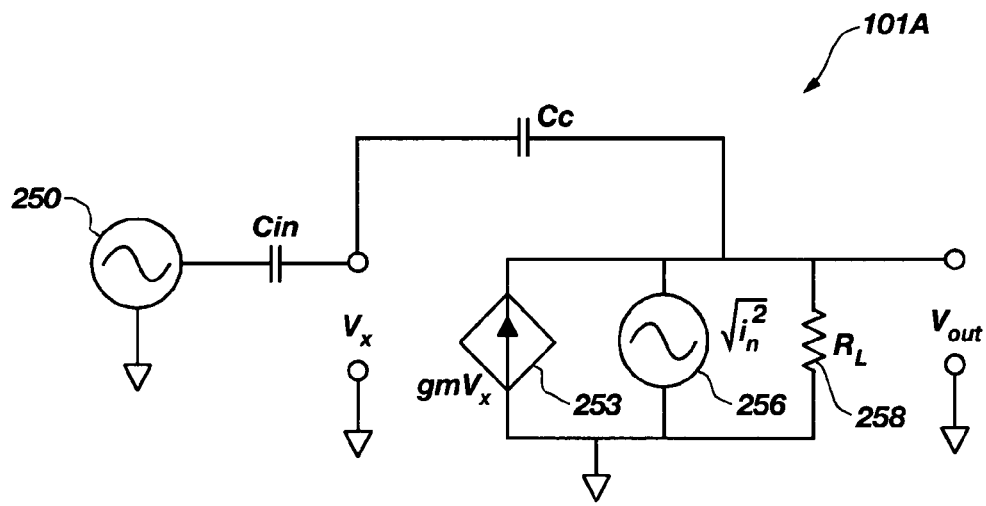
FIG. 5 depicts an exemplary simulation model for the switched capacitor amplifier of FIG. 4.

In operation, the differential transistor pair amplifies a voltage difference ($V_x$) between the non-inverting input 210 and the inverting input 220. FIG. 5 illustrates an approximate small signal simulation model 101A of the switched capacitor amplifier 100A of FIG. 4. It should be noted that the simulation model 101A is defined for the gain phase of the switched capacitor amplifier 100A and without the n-channel transistors of the switched capacitor networks. The reset phase is not simulated. The simulation model 101A includes a signal voltage source 250, the feed-in capacitor Cin, a voltage dependent current source 253, a noise source 256, a load 258, and a feedback capacitor Cc.

The signal voltage source 250 is configured for generating a small analog signal for amplification. The voltage dependent current source 253 models the amplification of the CMOS amplifier 200A by generating a current source proportional to the input signal $V_x$. Note that this configuration models the positive feedback by providing a current source, rather than the current sink of the conventional model illustrated in FIG. 2.

Before feedback, the gain for simulation model 101A shown in FIG. 5 is:

$$gain = (gm*R_L),$$

and the mean square noise voltage referred back to the input of the amplifier is:

$$Vi_n^2 = i_n^2/gm^2$$

After positive feedback is applied, from the amplifier output 280 back to the non-inverting input 210, the gain at low frequencies is:

$$gain = \frac{g_m R_L C_{in}}{C_{in} - C_c(g_m R_L - 1)}$$

It will be recognized from the gain equation that the circuit can still be conditionally stable and will not oscillate if Cin>Cc(gm*RL−1). However, the gain can become very high since the denominator can approach zero depending on the value of the feedback capacitor Cc.

The bandwidth of the simulation model 101A in radians/second is:

$$\omega_c = \frac{C_{in} - C_c(g_m R_L - 1)}{R_L C_{in} C_c}$$

As with the negative feedback amplifier, the mean square noise voltage referred to the input for the positive feedback embodiment is still:

$$Vi_n^2 = i_n^2/gm^2; \text{ if } Cin \gg Cc$$

The resulting noise power referred to the input for the simulation model 101A is:

$$NoisePower = \frac{1}{2\pi} * \frac{i_n^2}{g_m C_{in}} * \frac{C_{in} - C_c(g_m R_l - 1)}{g_m R_l C_c}$$

It will be recognized that the numerator in the noise power expression can approach zero as the amount of positive feedback increases since as the gain increases the bandwidth decreases and the bandwidth can become very small. A large gain amplifies both the signal and the noise but the smaller bandwidth reduces the noise power. A lower noise power means the signal power is dominant and, as a result, the signal may be easily detected.

Figure 6A:
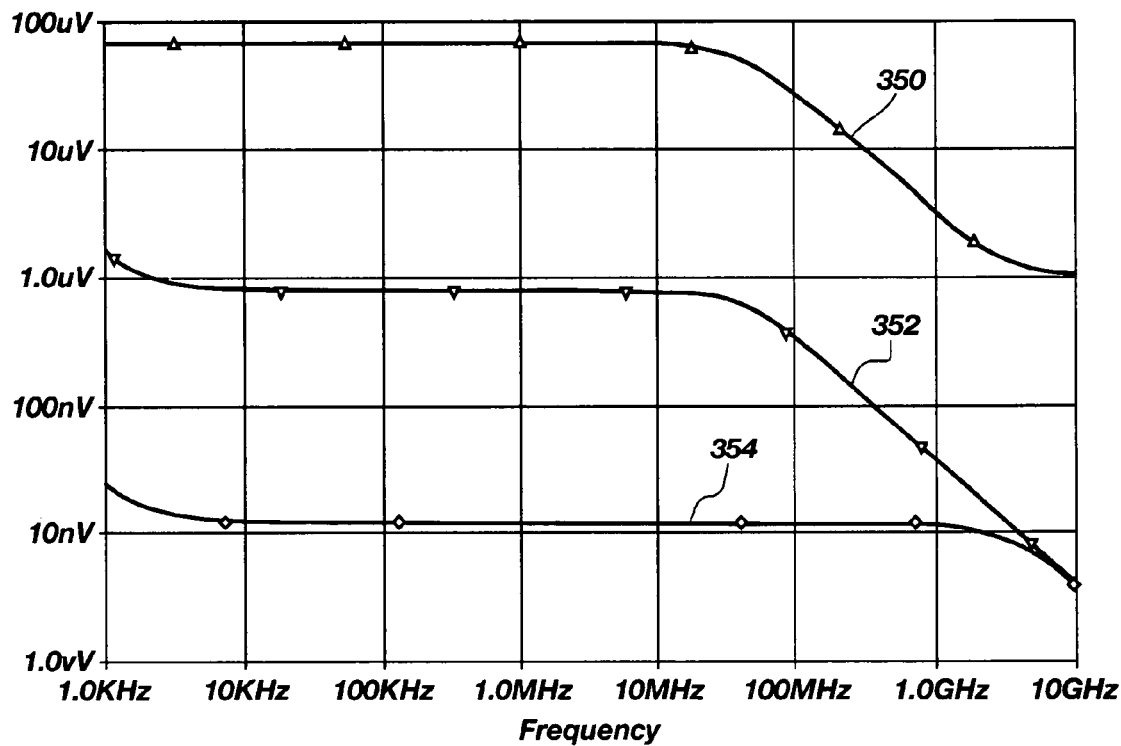
FIGS. 6A-6C depict simulation results for the simulation model of FIG. 5 at various feedback proportions of the switched feedback capacitance relative to the switched feed-in capacitance.
Figure 6B:
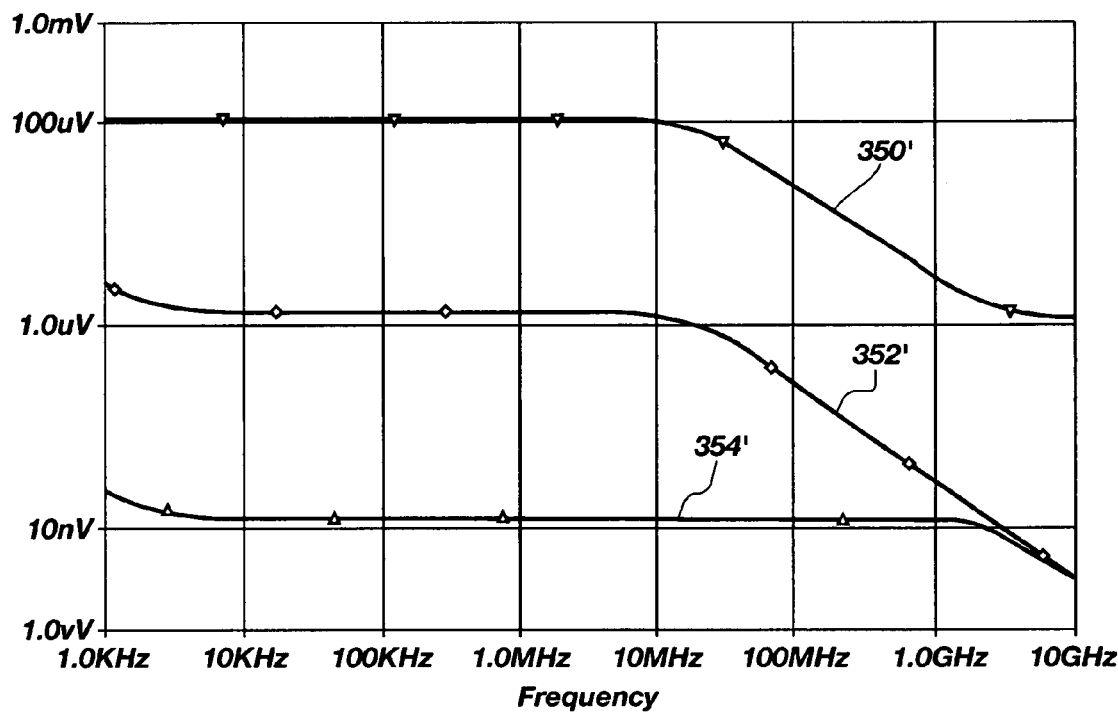
Figure 6C:
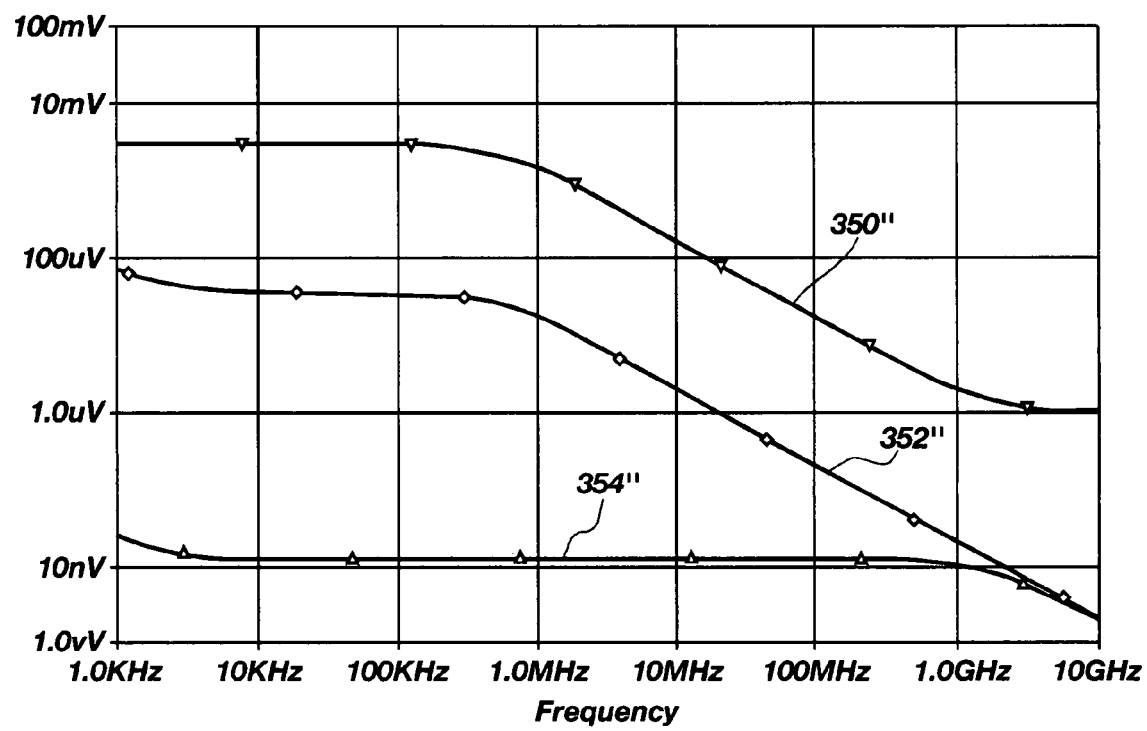

FIGS. 6A-6C illustrate simulation results of the FIG. 5 simulation model 101A for various feedback proportions of Cc/Cin. FIG. 6A, with a feedback proportion of about 0.015, illustrates an output signal curve 350 showing an output voltage of about 70 µV, an output noise curve 352 showing noise at the output of about $840_{nV}/\sqrt{Hz}$, and an input noise curve 354 showing noise at the input of about $12_{nV}/\sqrt{Hz}$. FIG. 6B, with a feedback proportion of about 0.02, illustrates an output signal curve 350' showing an output voltage of about 107 µV, an output noise curve 352' showing noise at the output of about $1,300_{nV}/\sqrt{Hz}$, and an input noise curve 354' showing noise at the input of about $12_{nV}/\sqrt{Hz}$. FIG. 6C, with a feedback proportion of about 0.03, illustrates an output signal curve 350" showing an output voltage of about 2800 µV, an output noise curve 352" showing noise at the output of about $34,000_{nV}/\sqrt{Hz}$, and an input noise curve 354" showing noise at the input of about $12_{nV}/\sqrt{Hz}$.

Figure 7A:
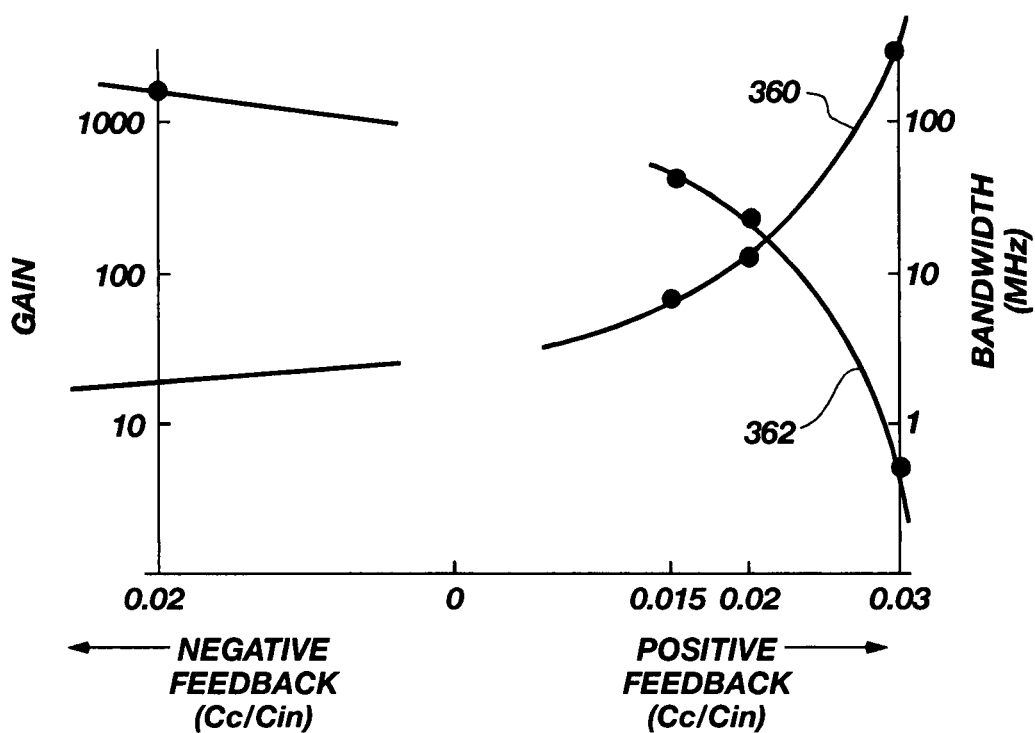
FIG. 7A depicts bandwidth and gain characteristics of exemplary switched capacitor amplifiers with both negative feedback and positive feedback and at various feedback proportions of the switched feedback capacitance relative to the switched feed-in capacitance.
Figure 7B:
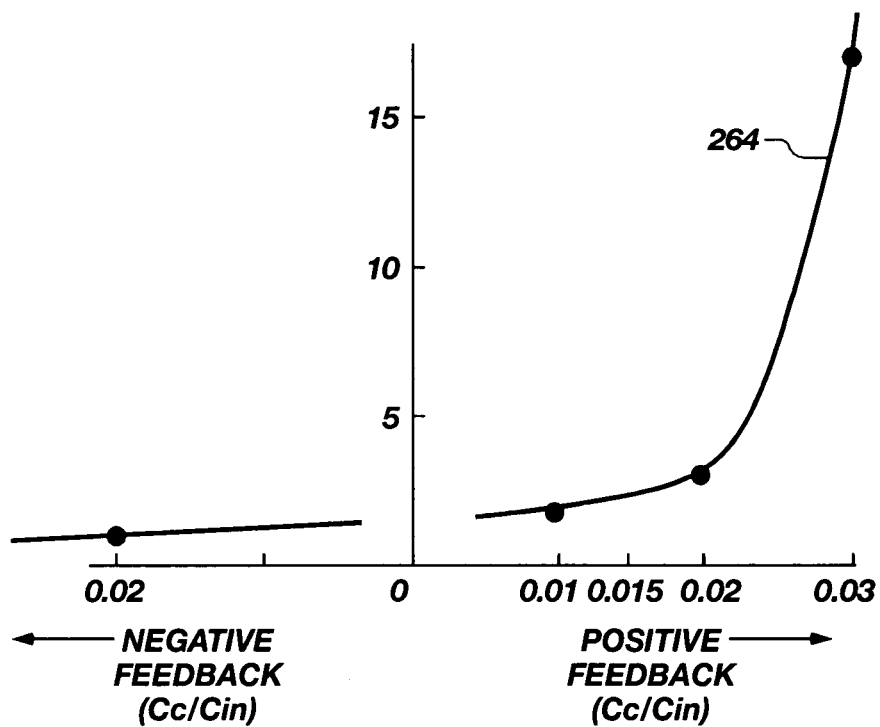
FIG. 7B depicts signal-to-noise ratio characteristics of exemplary switched capacitor amplifiers with both negative feedback and positive feedback and at various feedback proportions of the switched feedback capacitance relative to the switched feed-in capacitance.

These simulation results are summarized in FIGS. 7A and 7B. FIG. 7A illustrates a gain curve 360 and a bandwidth curve 362 for both positive feedback and negative feedback switched capacitor amplifiers. Negative feedback is illustrated along the x-axis to the left of the origin, while positive feedback is illustrated along the x-axis to the right of the origin. A y-axis scale at the left of the graph shows values for the gain curve 360, while a y-axis scale at the right of the graph shows values for the bandwidth curve 362. The gain curve 360 and bandwidth curve 362 do not show values near the origin of the x-axis because the amplifiers are not accurate as the feedback proportion approaches zero. FIG. 7A illustrates the increase in gain and decrease in bandwidth with increasing positive feedback.

FIG. 7B illustrates the signal-to-noise ratio (SNR) as an SNR curve 264 showing both positive feedback and negative feedback switched capacitor amplifiers. The x-axis is similar to the x-axis of FIG. 7A with negative feedback to the left and positive feedback to the right. The y-axis scale shows relative values of signal-to-noise ratio. As can be seen, a significant increase in signal-to-noise ratio may be achieved with increasing positive feedback. It will be recognized that the feedback proportion can be optimized in positive feedback switched capacitor amplifiers to significantly increase the signal-to-noise ratio while maintaining a stable gain and an acceptable bandwidth.

Figure 8:
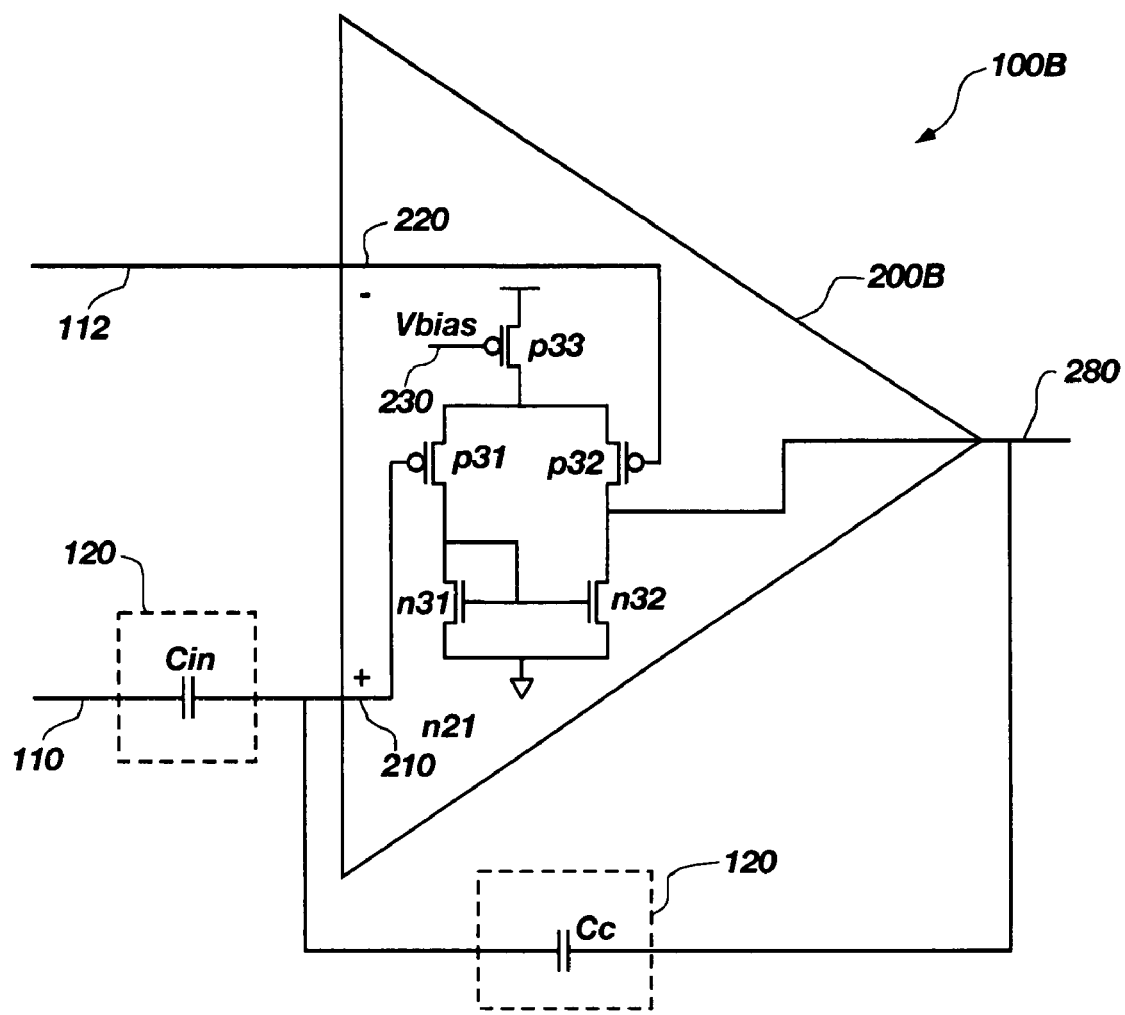
FIG. 8 is a circuit diagram of another exemplary embodiment of a switched capacitor amplifier according to the present invention.

FIG. 8 illustrates another exemplary embodiment of a positive feedback switched capacitor amplifier 100B using p-channel transistors for the differential transistor pair. As with the embodiment of FIG. 4, the embodiment of FIG. 8 includes an inverting input 220, which may be coupled to a reference signal 112, and a feed-in switched capacitor 120 coupled between the input signal 110 and the non-inverting input 210. This embodiment also includes a feedback switched capacitor 130 coupled between the amplifier output 280 and the non-inverting input 210. The boxes with dashed lines on the feed-in switched capacitor 120 and the feedback switched capacitor 130 indicate that the switches are implied and not shown in the diagram. The CMOS amplifier 200B in this embodiment comprises a current mirror formed by reference transistor n31 and current mirror transistor n32. The differential transistor pair is formed by first differential transistor p31 and second differential transistor p32. In this embodiment, a current source is provided by current source transistor p33. The operation of this CMOS amplifier 200B using p-channel transistors for the differential transistor pair is similar to operation of the embodiment of FIG. 4 using n-channel transistors for the differential transistor pair.

Figure 9:
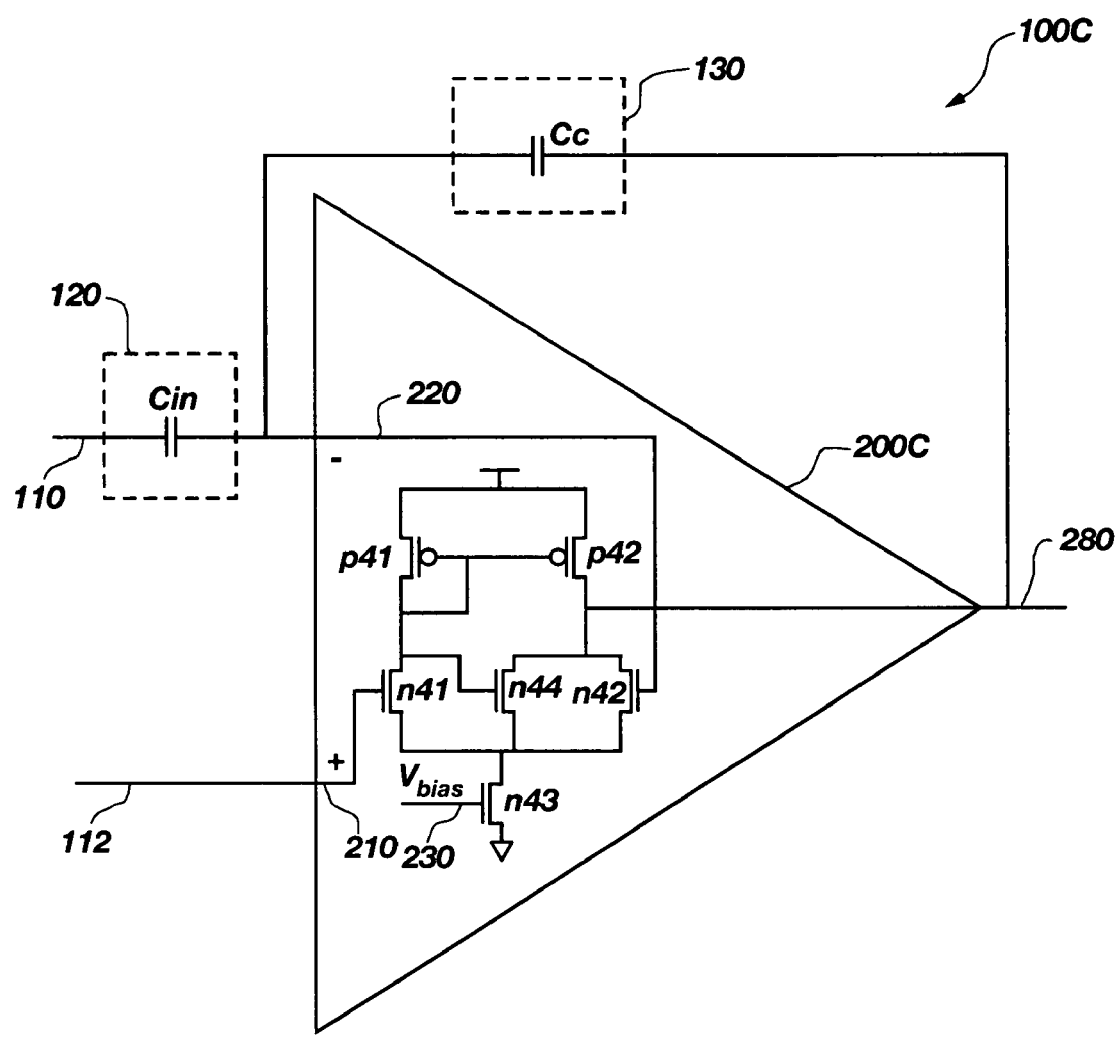
FIG. 9 is a circuit diagram of another exemplary embodiment of a switched capacitor amplifier according to the present invention illustrating a CMOS amplifier with positive feedback coupled with switched capacitors in a negative feedback configuration.

FIG. 9 illustrates another exemplary embodiment of a positive feedback switched capacitor amplifier 100C. As with the embodiment of FIG. 4, the embodiment of FIG. 9 includes a feed-in switched capacitor 120 and a feedback switched capacitor 130. However, in this embodiment, the amplifier comprises a positive feedback CMOS amplifier 200C, wherein the positive feedback is internal to the amplifier. As a result, the feedback switched capacitor 130 is coupled between the amplifier output 280 and the inverting input 220 of the positive feedback CMOS amplifier 200C to create negative feedback. Similarly, the feed-in switched capacitor 120 couples the input signal 110 to the inverting input 220. The non-inverting input 210 may be coupled to a suitable reference signal 112, which, in some applications may simply be a ground voltage.

The positive feedback CMOS amplifier 200C includes a current mirror comprising a reference transistor p41 and current mirror transistor p42. A bias current source is shown implemented as a bias transistor n43 controlled by a suitable bias voltage 230. The differential transistor pair comprising a first differential transistor n41 controlled by the non-inverting input 210 and a second differential transistor n42 controlled by the inverting input 220 is similar to that of the embodiment of FIG. 4. However, in the positive feedback CMOS amplifier 200C, a small n-channel transistor n44 (also referred to as a positive feedback transistor) is coupled in parallel with the second differential transistor n42.

The positive feedback, taken from the diode-connected side of the differential amplifier is near unity gain and the amount of feedback will be controlled by the width to length ratio of the positive feedback transistor n44 in parallel with the second differential transistor n42. Therefore, the overall gain of the positive feedback CMOS amplifier 200C will be increased in proportion to the size of the positive feedback transistor n44. As a result, the magnitude of the positive feedback is easily controlled in this embodiment because the feedback is controlled simply by relative physical dimensions of the devices.

The negative feedback proportion formed by the negative feedback switched capacitor 130 relative to the feed-in switched capacitor 120, may be modified and optimized with the gain of the positive feedback within the positive feedback CMOS amplifier 200C to create an effect similar to the switched capacitor amplifiers (100A, 100B) of FIGS. 4 and 8.

Figure 10A:
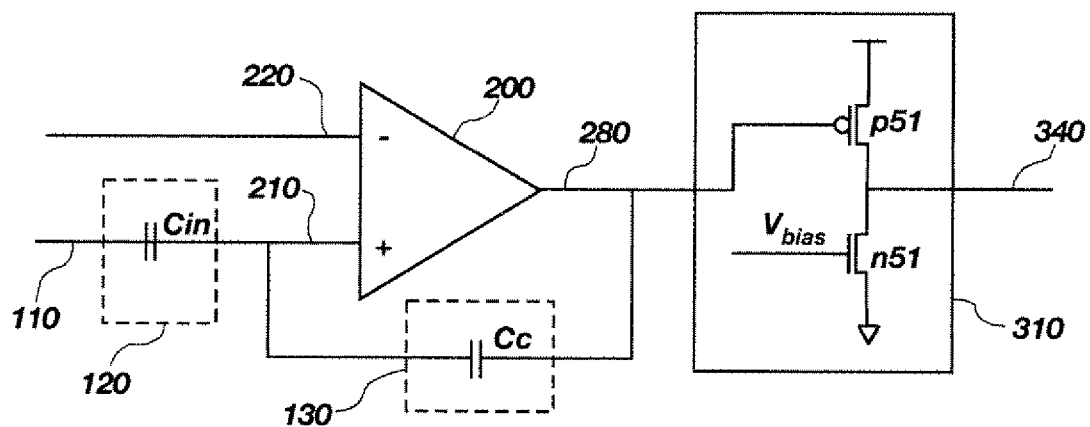
FIGS. 10A-10C are block diagrams of exemplary embodiments of switched capacitor amplifiers including additional buffer stages according to the present invention.
Figure 10B:
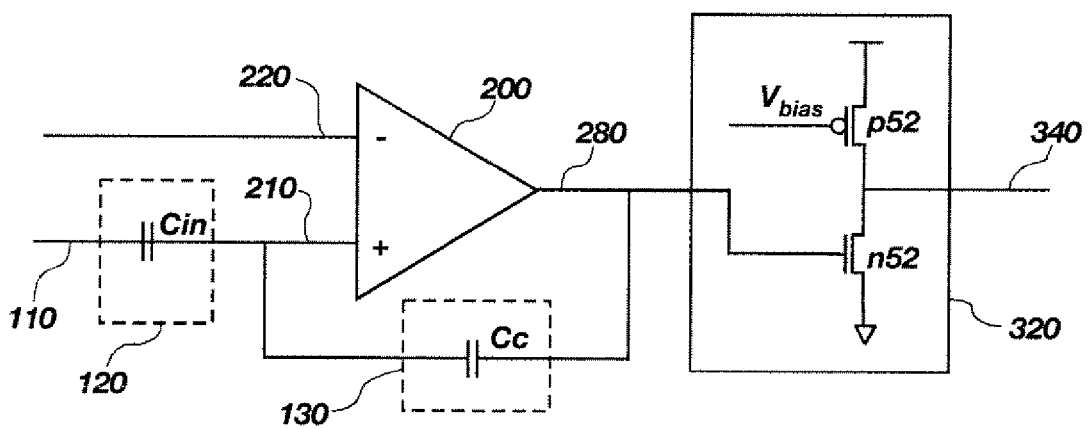
Figure 10C:
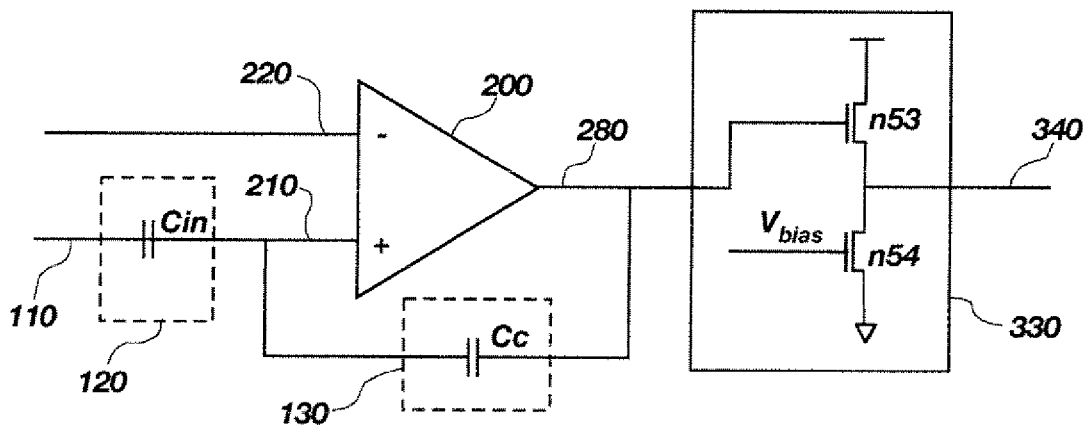

FIGS. 10A-10C illustrate incorporation of various output stages with the differential CMOS amplifiers (200A, 200B, 200C) of FIGS. 4, 8, and 9, to form an operational amplifier by buffering, and possibly amplifying the amplifier output 280 to generate a buffered amplifier output 340. FIG. 10A illustrates a PMOS output buffer 310 comprising a p-channel output transistor p51 coupled to a bias current sink formed from an n-channel bias transistor n51 coupled to a suitable bias voltage. FIG. 10B illustrates an NMOS output buffer 320 comprising an n-channel output transistor n52 coupled to a bias current source formed from a p-channel bias transistor p52 coupled to a suitable bias voltage. FIG. 10C illustrates an NMOS source follower output buffer 330 comprising an n-channel output transistor n53 in a source follower configuration coupled to a bias current source formed from an n-channel bias transistor n54 coupled to a suitable bias voltage.

The embodiments shown in FIGS 10A-10C show the output buffers (310, 320, 330) after the positive feedback from the differential amplifier output 280. Those of ordinary skill in the art will recognize that the scope of the present invention also comprises output stages placed in front of the feedback path (i.e., the buffered amplifier output 340 is used for the feedback). The output stage for the embodiment of FIG. 10C does not create an additional signal inversion. However, in the embodiments of FIGS. 10A and 10B the output stage in the feedback path creates an additional signal inversion. As a result, to form the proper feedback, the feedback path may be simply switched from the non-inverting input 210 to the inverting input 220 for external positive feedback embodiments (100A shown in FIG. 4, or 100B shown in FIG. 8), or from the inverting input 220 to the non-inverting input 210 for external negative feedback implementations (100C shown in FIG. 9). Similarly, additional output stages 300, either before or after the feedback path, are contemplated as within the scope of the invention.

Figure 11A:
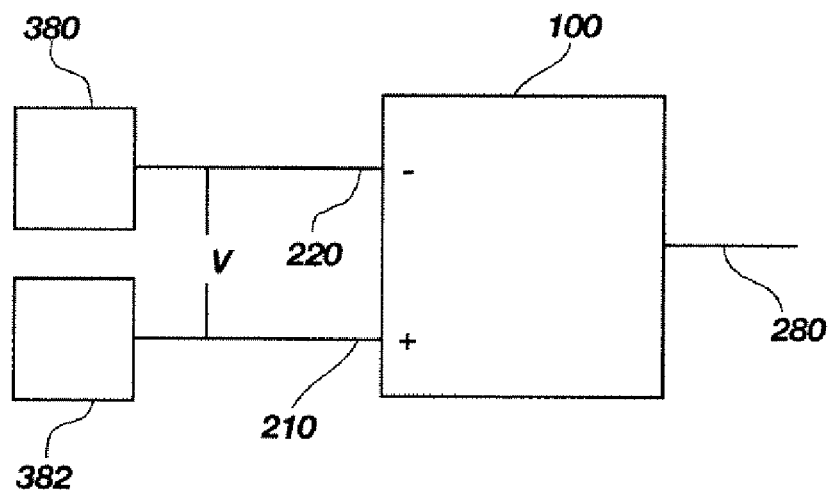
FIGS. 11A-11B are block diagrams of exemplary embodiments using switch capacitor amplifiers according to the present invention.
Figure 11B:
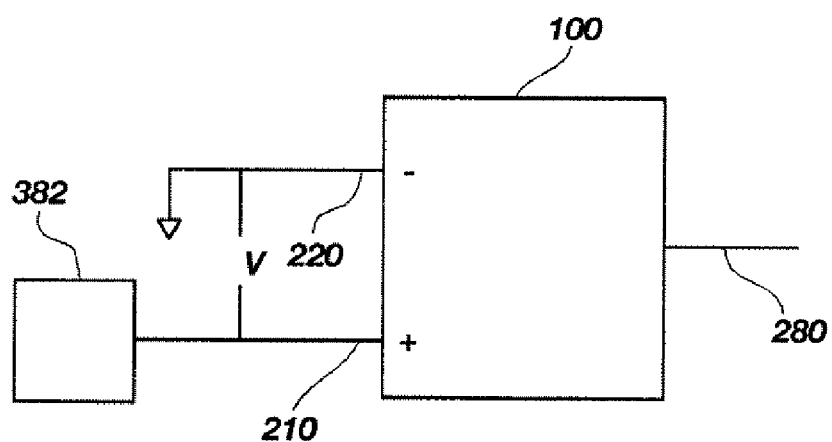

FIGS. 11A and 11B illustrate exemplary embodiments for which the positive feedback switched capacitor amplifier 100 may be used in accordance with the present invention. FIG. 11A illustrates a differential implementation wherein a reference producer 380 that develops a reference voltage is coupled to the inverting input 220 of the switched capacitor amplifier 100. A signal producer 382 develops a signal to be amplified, which is coupled to the non-inverting input 210 of the switched capacitor amplifier 100 to generate an amplified version of the output of the signal producer 382 on the amplifier output 280. By way of example and not limitation, the signal producer 382 may be a portion of a memory circuit that develops a small AC or DC signal, the signal producer 382 may be from an input pad of a semiconductor device 410 carrying a small AC or DC signal, or the signal producer 382 may be a sensor that generates a small AC or DC signal. Other examples for the signal producer 382 are an image sensor, an input to an analog to digital converter, a temperature sensor, a wireless receiver, a fiber optic cable, or any number of electronic components.

FIG. 11B illustrates a single input implementation wherein the signal producer 382 is coupled to the non-inverting input 210 of the switched capacitor amplifier 100 to generate an amplified version of the output of the signal producer 382 on the amplifier output 280. In this implementation, it may be appropriate to compare the signal from the signal producer 382 to a ground potential. Therefore, the inverting input 220 may be coupled to a ground voltage.

Embodiments of the present invention, while mostly described in relation to semiconductor memories, are applicable to many semiconductor devices. By way of example, any semiconductor device requiring amplification of small analog signals may use the present invention.

Figure 12:
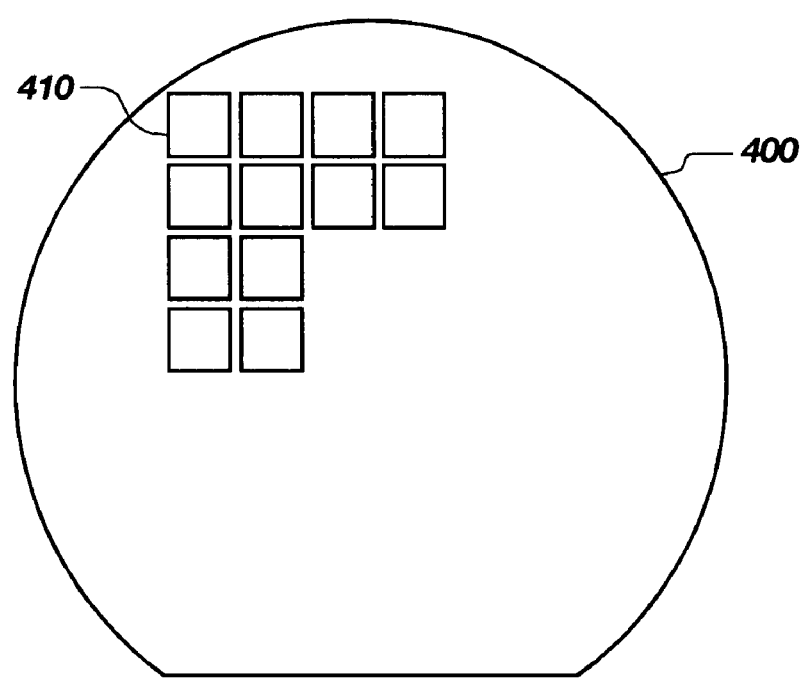
FIG. 12 is a semiconductor wafer containing a plurality of semiconductor devices containing a switched capacitor amplifier according to the present invention.

As shown in FIG. 12, a semiconductor wafer 400, in accordance with the present invention, includes a plurality of semiconductor devices 410, each semiconductor device 410 incorporating one or more of the switched capacitor amplifiers 100 (not shown) described herein. Of course, it should be understood that the semiconductor devices 410 may be fabricated on bulk substrates other than a silicon wafer, such as, for example, a Silicon On Insulator (SOI) substrate, a Silicon On Glass (SOG) substrate, and a Silicon On Sapphire (SOS) substrate. It is also contemplated that semiconductor devices 410 may be fabricated on substrates of semiconductor materials other than silicon, such as silicon-germanium, germanium, gallium arsenide and indium phosphide substrates.

Figure 13:
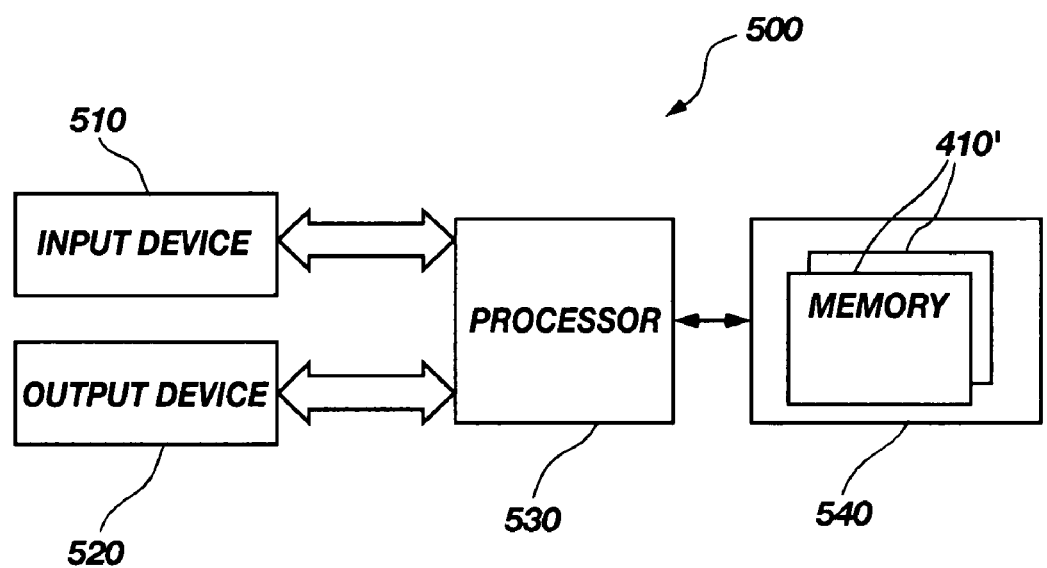
FIG. 13 is a computing system diagram showing a plurality of semiconductor memories containing a switched capacitor amplifier according to the present invention.

As shown in FIG. 13, an electronic system 500, in accordance with the present invention, comprises an input device 510, an output device 520, a processor 530, and a memory device 540. The memory device 540 comprises at least one semiconductor memory 410' incorporating the switched capacitor amplifier 100 described herein in a DRAM device. It should be understood that the semiconductor memory 410' might comprise a wide variety of devices other than a DRAM, including, for example, Static RAM (SRAM) devices, and Flash memory devices.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:
1. A switched capacitor amplifier, comprising:
   a positive feedback CMOS amplifier, comprising:
      an inverting input;
      a non-inverting input; and
      an amplifier output;
   a reference signal carrying a reference voltage operably coupled to the non-inverting input;
   a feed-in switched capacitor operably coupled between an input signal and the inverting input;
   a feedback switched capacitor operably coupled between the amplifier output and the inverting input; and
   wherein a feedback proportion, comprising a capacitance of the feedback switched capacitor relative to a capacitance of the feed-in switched capacitor, is configured to maintain a stable gain of the switched capacitor amplifier and increase a signal-to-noise ratio of the switched capacitor amplifier.

2. The switched capacitor amplifier of claim 1, wherein the reference voltage is set to a ground voltage.

3. The switched capacitor amplifier of claim 1, wherein the feedback proportion is further configured relative to a gain of the positive feedback CMOS amplifier to optimize the stable gain of the switched capacitor amplifier while maintaining a predetermined acceptable signal-to-noise ratio.

4. The switched capacitor amplifier of claim 1, wherein the CMOS amplifier comprises:
   a current mirror configured for providing a reference current and a mirrored current proportional to the reference current;
   a differential transistor pair comprising:
      a first differential transistor in a path of the reference current, the first differential transistor operably coupled to the non-inverting input and configured to generate an internal feedback signal; and
      a second differential transistor in a path of the mirrored current, the second differential transistor operably coupled to the inverting input and the amplifier output;
      wherein the differential transistor pair is configured to provide the amplifier output with an output voltage proportional to a voltage difference between the non-inverting input and the inverting input;
   a positive feedback transistor operably coupled in parallel with the second differential transistor and configured to modify the output voltage responsive to the internal feedback signal; and
   a bias current sink configured for sinking a bias current for the differential transistor pair and the positive feedback transistor.

5. The switched capacitor amplifier of claim 1, wherein the CMOS amplifier comprises:
   a current mirror configured for providing a reference current and a mirrored current proportional to the reference current;
   a differential transistor pair comprising:
      a first differential transistor in a path of the reference current, the first differential transistor operably coupled to the non-inverting input and configured to generate an internal feedback signal; and
      a second differential transistor in a path of the mirrored current, the second differential transistor operably coupled to the inverting input and the amplifier output;
      wherein the differential transistor pair is configured to provide the amplifier output with an output voltage proportional to a voltage difference between the non-inverting input and the inverting input;

a positive feedback transistor operably coupled in parallel with the second differential transistor and configured to modify the output voltage responsive to the internal feedback signal; and a bias current source configured for sourcing a bias current for the differential transistor pair and the positive feedback transistor.

6. The switched capacitor amplifier of claim 1, wherein the CMOS amplifier further comprises at least one output stage configured for buffering the amplifier output.

7. The switched capacitor amplifier of claim 6, wherein the at least one output stage comprises an output buffer selected from the group consisting of a PMOS output buffer, an NMOS output buffer, and an NMOS source follower output buffer.

8. The switched capacitor amplifier of claim 1, further comprising an input circuit configured for operably coupling to the feed-in switched capacitor, the input circuit selected from the group consisting of a memory device output and a sensor output.

9. A method of amplifying a signal, comprising:
coupling a reference voltage to a non-inverting input of a CMOS amplifier;
coupling an input signal, through a switched feed-in capacitance, to an inverting input of the CMOS amplifier;
amplifying the inverting input using a positive feedback CMOS amplifier to generate an amplifier output;
feeding back the amplifier output, through a switched feedback capacitance, to the inverting input; and
selecting the switched feedback capacitance and the switched feed-in capacitance to maintain a stable gain of the positive feedback CMOS amplifier and increase a signal-to-noise ratio of the positive feedback CMOS amplifier.

10. The method of claim 9, further comprising setting the reference voltage to a ground voltage.

11. The method of claim 9, wherein selecting the switched feedback capacitance and the switched feed-in capacitance further comprises optimizing the stable gain while maintaining a predetermined acceptable signal-to-noise ratio.

12. A semiconductor device including at least one switched capacitor amplifier, the at least one switched capacitor amplifier comprising:
a positive feedback CMOS amplifier, comprising:
an inverting input;
a non-inverting input; and
an amplifier output;
a reference signal carrying a reference voltage operably coupled to the non-inverting input;
a feed-in switched capacitor operably coupled between an input signal and the inverting input;
a feedback switched capacitor operably coupled between the amplifier output and the inverting input; and
wherein a feedback proportion, comprising a capacitance of the feedback switched capacitor relative to a capacitance of the feed-in switched capacitor, is configured to maintain a stable gain of the switched capacitor amplifier and increase a signal-to-noise ratio of the switched capacitor amplifier.

13. The semiconductor device of claim 12, wherein the feedback proportion is further configured relative to a gain of the positive feedback CMOS amplifier to optimize the stable gain of the switched capacitor amplifier while maintaining a predetermined acceptable signal-to-noise ratio.

14. A semiconductor wafer, comprising:
at least one semiconductor device including at least one switched capacitor amplifier, the at least one switched capacitor amplifier comprising:
a positive feedback CMOS amplifier, comprising:
an inverting input;
a non-inverting input; and
an amplifier output;
a reference signal carrying a reference voltage operably coupled to the non-inverting input;
a feed-in switched capacitor operably coupled between an input signal and the inverting input;
a feedback switched capacitor operably coupled between the amplifier output and the inverting input; and
wherein a feedback proportion, comprising a capacitance of the feedback switched capacitor relative to a capacitance of the feed-in switched capacitor, is configured to maintain a stable gain of the switched capacitor amplifier and increase a signal-to-noise ratio of the switched capacitor amplifier.

15. The semiconductor wafer of claim 14, wherein the feedback proportion is further configured relative to a gain of the positive feedback CMOS amplifier to optimize the stable gain of the switched capacitor amplifier while maintaining a predetermined acceptable signal-to-noise ratio.

16. An electronic system, comprising:
at least one input device;
at least one output device;
at least one processor; and
a memory device comprising, at least one semiconductor memory including at least one switched capacitor amplifier, the at least one switched capacitor amplifier comprising:
a positive feedback CMOS amplifier, comprising:
an inverting input;
a non-inverting input; and
an amplifier output;
a reference signal carrying a reference voltage operably coupled to the non-inverting input;
a feed-in switched capacitor operably coupled between an input signal and the inverting input;
a feedback switched capacitor operably coupled between the amplifier output and the inverting input; and
wherein a feedback proportion, comprising a capacitance of the feedback switched capacitor relative to a capacitance of the feed-in switched capacitor, is configured to maintain a stable gain of the switched capacitor amplifier and increase a signal-to-noise ratio of the switched capacitor amplifier.

17. The electronic system of claim 16, wherein the feedback proportion is further configured relative to a gain of the positive feedback CMOS amplifier to optimize the stable gain of the switched capacitor amplifier while maintaining a predetermined acceptable signal-to-noise ratio.

* * * * *